United States Patent
Noh et al.

(10) Patent No.: US 11,735,491 B2
(45) Date of Patent: Aug. 22, 2023

(54) SEMICONDUCTOR PACKAGE DEVICE

(71) Applicant: Samsung Electronics Co., Ltd., Suwon-si (KR)

(72) Inventors: Hyunggyun Noh, Suwon-si (KR); Gun-Hee Bae, Seongnam-si (KR); Sangwoo Pae, Suwon-si (KR); Jinsoo Bae, Seongnam-si (KR); Deok-Seon Choi, Hwaseong-si (KR); Il-Joo Choi, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 104 days.

(21) Appl. No.: 17/505,953

(22) Filed: Oct. 20, 2021

(65) Prior Publication Data
US 2022/0301969 A1 Sep. 22, 2022

(30) Foreign Application Priority Data
Mar. 18, 2021 (KR) .......................... 10-2021-0034985

(51) Int. Cl.
*H01L 23/367* (2006.01)
*H01L 23/40* (2006.01)
*H01L 23/22* (2006.01)

(52) U.S. Cl.
CPC ............ *H01L 23/367* (2013.01); *H01L 23/22* (2013.01); *H01L 23/4012* (2013.01); *H01L 2023/4087* (2013.01)

(58) Field of Classification Search
CPC .................................................... H01L 23/367
USPC ........................................................ 257/712
See application file for complete search history.

(56) References Cited

U.S. PATENT DOCUMENTS

| | | |
|---|---|---|
| 6,577,013 B1 | 6/2003 | Glenn et al. |
| 8,743,582 B2 | 6/2014 | Kang et al. |
| 8,928,132 B2* | 1/2015 | Choi ................... H01L 23/3128 257/E25.027 |
| 2008/0032448 A1 | 2/2008 | Simon et al. |
| 2012/0038045 A1 | 2/2012 | Lee |
| 2012/0098145 A1 | 4/2012 | Koshida et al. |
| 2017/0047309 A1 | 2/2017 | Baek et al. |
| 2018/0145061 A1* | 5/2018 | Jeong ................... H01L 23/5385 |
| 2019/0157244 A1 | 5/2019 | Hong |

FOREIGN PATENT DOCUMENTS

| | | |
|---|---|---|
| KR | 101751045 B1 | 6/2017 |
| KR | 101817159 B1 | 2/2018 |

* cited by examiner

*Primary Examiner* — Ajay Arora
(74) *Attorney, Agent, or Firm* — Muir Patent Law, PLLC

(57) ABSTRACT

A semiconductor package device includes a package substrate, an interposer on the package substrate, a semiconductor package on the interposer, and an under-fill between the interposer and the semiconductor package. The interposer includes at least one first trench at an upper portion of the interposer that extends in a first direction parallel to a top surface of the package substrate. The at least one first trench vertically overlaps an edge region of the semiconductor package. The under-fill fills at least a portion of the at least one trench.

20 Claims, 12 Drawing Sheets

FIG. 10
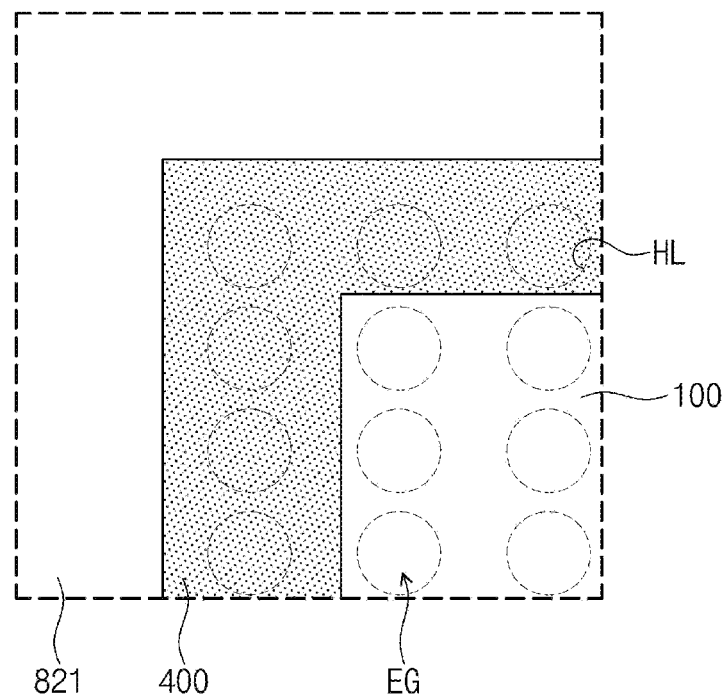
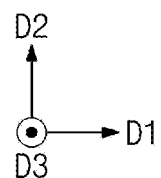

SEMICONDUCTOR PACKAGE DEVICE

CROSS-REFERENCE TO RELATED APPLICATION

This U.S. nonprovisional application claims priority under 35 U.S.C § 119 to Korean Patent Application No. 10-2021-0034985 filed on Mar. 18, 2021 in the Korean Intellectual Property Office, the disclosure of which is hereby incorporated by reference in its entirety.

BACKGROUND

The present inventive concepts relate to a semiconductor package device.

In response to the rapid development of the electronic industry and user demands, electronic products have become smaller and increasingly multifunctional. For such electronic products, miniaturization and multi-functionality of semiconductor devices used for electronic products are desirable. Accordingly, there has been a proposed semiconductor package in which a plurality of semiconductor chips having through electrodes are stacked in a vertical direction.

SUMMARY

When a semiconductor package is disposed on an interposer, a stress may be applied to an upper portion of the interposer adjacent to an edge of the semiconductor package. Some example embodiments of the present inventive concepts provide a semiconductor package device capable of reducing the stress.

An object of the present inventive concepts is not limited to the mentioned above, and other objects which have not been mentioned above will be clearly understood to those skilled in the art from the following description.

According to some example embodiments of the present inventive concepts, a semiconductor package device may include a package substrate, an interposer on the package substrate, a semiconductor package on the interposer, and an under-fill between the interposer and the semiconductor package. The interposer may be provided with at least one first trench at an upper portion of the interposer, and the at least one first trench may extend in a first direction parallel to a top surface of the package substrate. The at least one first trench may vertically overlap an edge region of the semiconductor package. The under-fill may fill at least a portion of the at least one first trench.

According to some example embodiments of the present inventive concepts, a semiconductor package device may include a package substrate, an interposer on the package substrate, a semiconductor package on the interposer, and an under-fill between the interposer and the semiconductor package. The interposer may include a silicon substrate, a wiring layer on the silicon substrate, and an upper pad on the wiring layer. The wiring layer may include a dielectric layer provided with a plurality of concave portions at an upper portion of the dielectric layer, the plurality of concave portions vertically overlapping an edge region of the semiconductor package, and a wiring structure in the dielectric layer. The wiring structure may include a via part in contact with the upper pad. A depth of each of the concave portions may be less than a thickness of the via part.

According to some example embodiments of the present inventive concepts, a semiconductor package device may include a package substrate, an interposer on the package substrate, a plurality of semiconductor packages on the interposer, each of the plurality of semiconductor packages including a first semiconductor chip and a plurality of second semiconductor chips that are sequentially stacked on each other, and an under-fill between the interposer and the first semiconductor chip. Each of the first and second semiconductor chips may include a plurality of through electrodes. The interposer may be provided with a plurality of trenches at an upper portion of the interposer, and the plurality of trenches may extend in a first direction parallel to a top surface of the package substrate. At least one of the trenches may vertically overlap an edge region of the first semiconductor chip. The under-fill may fill at least a portion of each of the trenches. Each of the trenches may have a width in a second direction parallel to the top surface of the package substrate. The second direction may intersect the first direction. The trenches may be spaced apart from each other at a pitch in the second direction. The width may be between about 10 μm and about 15 μm. The pitch may be between about 10 μm and about 15 μm. A depth of each of the trenches may be between about 30 μm and about 50 μm.

BRIEF DESCRIPTION OF THE DRAWINGS

FIGS. 9 and 10 illustrate enlarged plan views showing section aa of FIG. 1.

DETAILED DESCRIPTION OF EMBODIMENTS

The following will describe a semiconductor package according to the present inventive concepts with reference to accompanying drawings.

Figure 1:
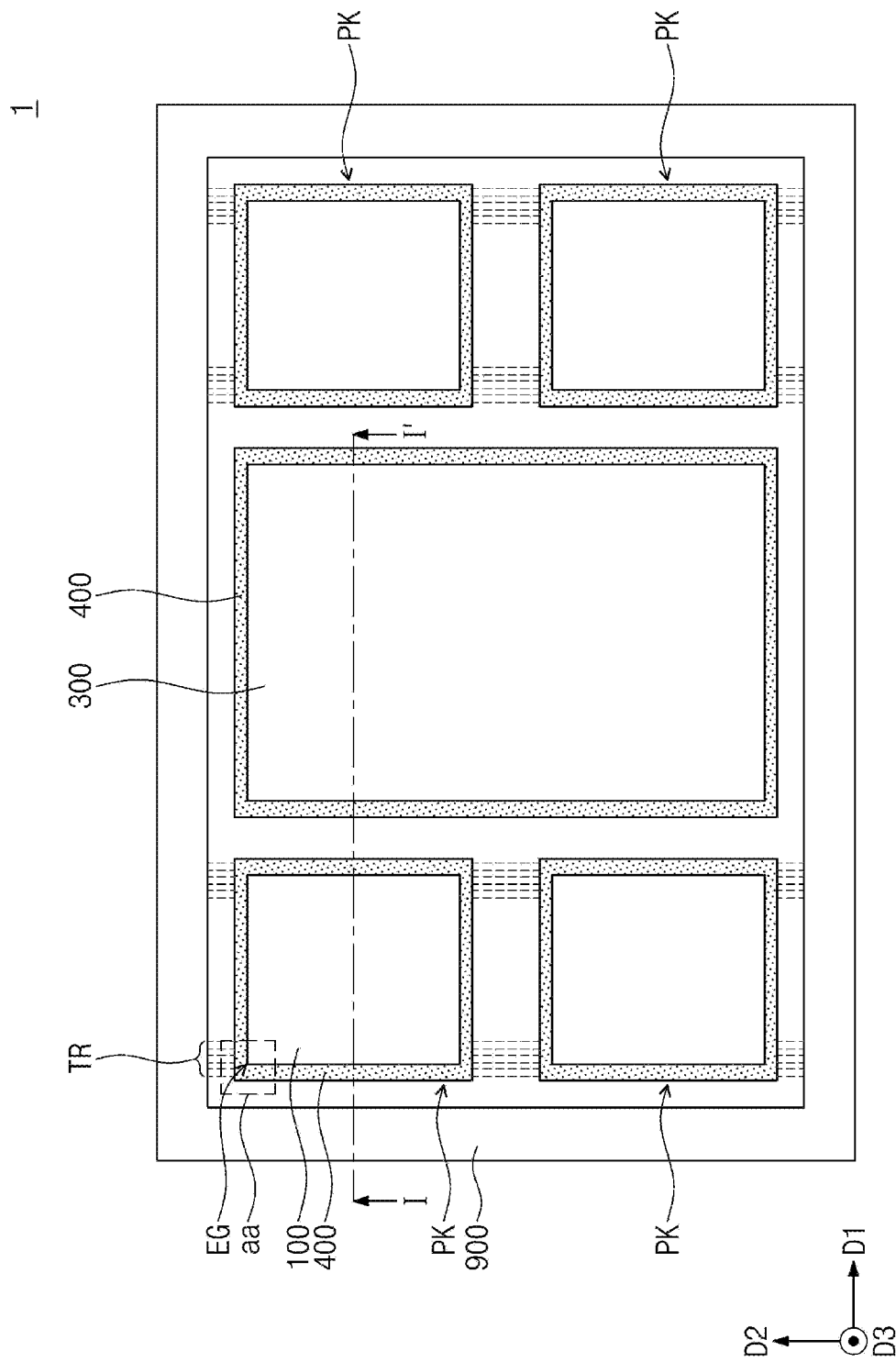
FIG. 1 illustrates a plan view showing a semiconductor device according to some example embodiments of the present inventive concepts.
Figure 2:
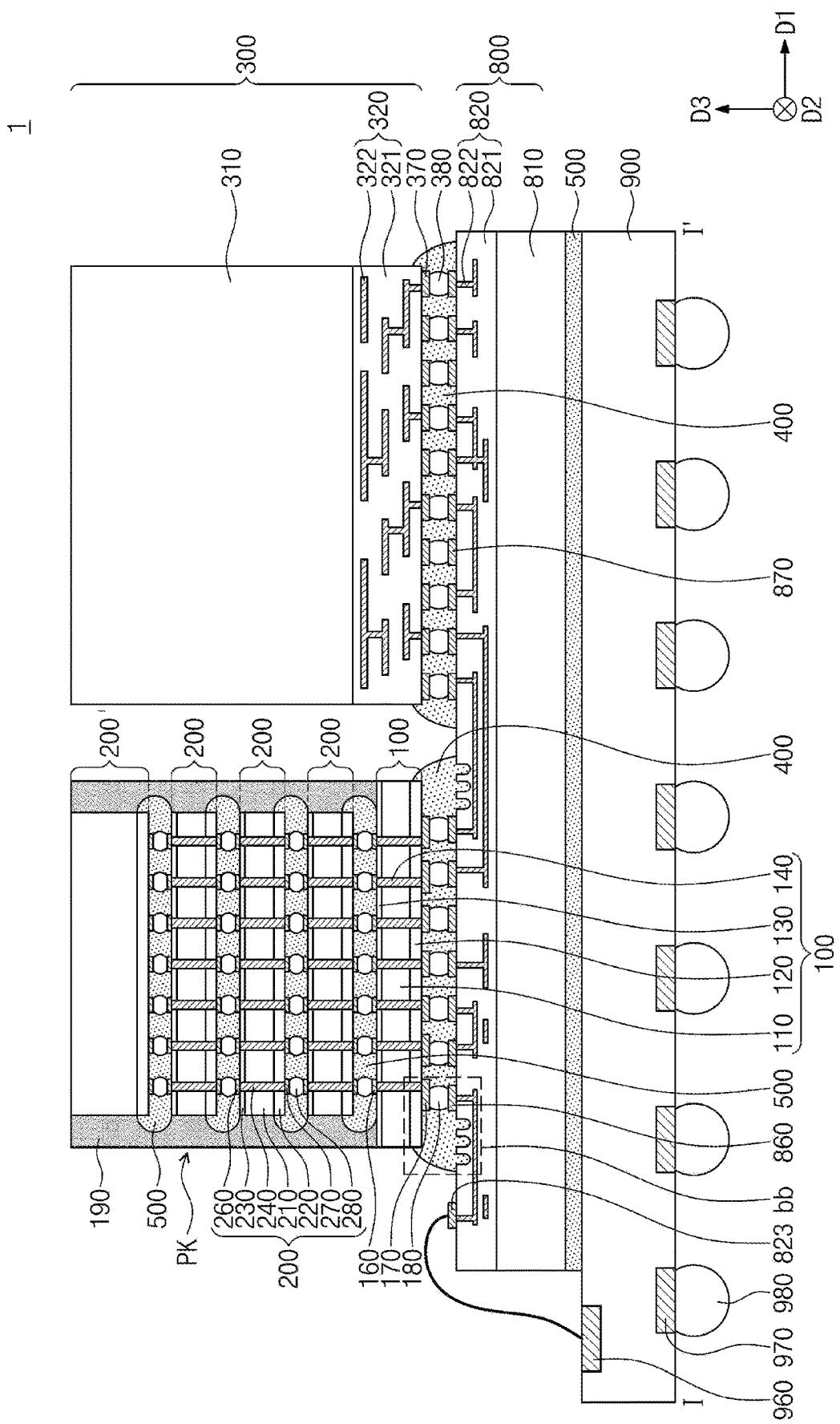
FIG. 2 illustrates a cross-sectional view taken along line I-I' of FIG. 1.

FIG. 1 illustrates a plan view showing a semiconductor package device 1 according to the present inventive concepts. FIG. 2 illustrates a cross-sectional view taken along line I-I' of FIG. 1. For clarity, some components are omitted in FIG. 2.

Referring to FIGS. 1 and 2, the semiconductor package device 1 may include a package substrate 900, an interposer 800, a plurality of semiconductor packages PK, and a third semiconductor chip 300. In some embodiments, the semiconductor packages PK may have the same configuration as each other. For example, each of the semiconductor packages PK may include a first semiconductor chip 100 and second semiconductor chips 200 and 200'.

Two semiconductor packages PK may be provided at a region adjacent to a first side of the third semiconductor chip 300, and another two semiconductor packages PK may be provided at a region adjacent to a second side of the third semiconductor chip 300. In some embodiments, the first and second sides of the third semiconductor chip 300 may be opposite to each other. Based on design, a variation may be introduced to the number of the semiconductor packages PK, arrangement of the semiconductor packages PK with respect to the third semiconductor chip 300, and placement of the third semiconductor chip 300.

The package substrate 900 may be, for example, a printed circuit board. In this description below, a first direction D1 is defined to refer to a direction parallel to a top surface of the package substrate 900. A second direction D2 is defined to refer to a direction that is parallel to the top surface of the package substrate 900 and intersects the first direction D1. A third direction D3 is defined to refer to a direction perpendicular to the top surface of the package substrate 900.

The package substrate 900 may include an upper metal pad 960 and a lower metal pad 970. An external connection terminal 980 may be provided on the lower metal pad 970. The external connection terminal 980 may be, for example, a solder ball.

The interposer 800 may be provided on the package substrate 900. The interposer 800 may include a silicon substrate 810 and a wiring layer 820. The wiring layer 820 may be provided on the silicon substrate 810. The wiring layer 820 may include a dielectric layer 821 and a wiring structure 822. The dielectric layer 821 may include or may be formed of a dielectric material. In some embodiments, the dielectric material of the dielectric layer 821 may include an epoxy compound and fiberglass. For example, the fiberglass is impregnated in the epoxy compound. The wiring structure 822 may include or may be formed of a metallic material, for example, copper (Cu). An upper pad 860 may be provided on an upper portion of the wiring layer 820, and the upper pad 860 may be connected to the wiring structure 822 and/or a bonding wire.

The semiconductor package PK may include the first semiconductor chip 100 and the second semiconductor chips 200 and 200'. The second semiconductor chips 200 and 200' may be stacked in a vertical direction on the first semiconductor chip 100. For example, the semiconductor package PK may include a semiconductor chip stack.

The first semiconductor chip 100 may be called a base chip or a buffer chip. In some embodiments, the first semiconductor chip 100 may be a logic chip. The first semiconductor chip 100 may be, for example, a memory controller.

The first semiconductor chip 100 may include a first semiconductor substrate 110, a first circuit layer 120, a first passivation layer 130, and a plurality of first through electrodes 140. The first semiconductor substrate 110 may be, for example, a silicon substrate. The first circuit layer 120 may be provided on a bottom surface of the first semiconductor substrate 110, and the first passivation layer 130 may be provided on a top surface of the first semiconductor substrate 110. The first circuit layer 120 may have therein an integrated circuit such as a transistor. The first passivation layer 130 may be a dielectric layer such as a silicon oxide layer and a silicon nitride layer. The first through electrodes 140 may penetrate the first semiconductor substrate 110, the first circuit layer 120, and the first passivation layer 130. The first through electrodes 140 may include or may be formed of a conductive material. First lower pads 170 may be provided on a bottom surface of the first circuit layer 120, and first upper pads 160 may be provided on a top surface of the first passivation layer 130. First connection terminals 180 may be provided on first lower pads 170, respectively. The first semiconductor chip 100 may be electrically connected through the first connection terminals 180 to the interposer 800.

The second semiconductor chips 200 and 200' may have a different function from that of the first semiconductor chip 100. The second semiconductor chips 200 and 200' may include a memory chip, such as dynamic random access memory (DRAM).

In some embodiments, an uppermost second semiconductor chip 200', and the semiconductor chips 200 may have the same configuration as each other. For example, each of the second semiconductor chips 200 and 200' may include a second semiconductor substrate 210, a second circuit layer 220, a second passivation layer 230, and a plurality of second through electrodes 240. The second semiconductor substrate 210 may be, for example, a silicon substrate. The second circuit layer 220 may be provided on a bottom surface of the second semiconductor substrate 210. In some embodiment, the second circuit layer 220 of the semiconductor chips 200 and 200' may be the same memory chip, such as dynamic random access memory (DRAM). The second passivation layer 230 may be provided on a top surface of the second semiconductor substrate 210. The second circuit layer 220 may have therein an integrated circuit such as a transistor. The second passivation layer 230 may be a dielectric layer such as a silicon oxide layer and a silicon nitride layer. The second through electrodes 240 may penetrate the second semiconductor substrate 210, the second circuit layer 220, and the second passivation layer 230. The second through electrodes 240 may include or may be formed of a conductive material. Second lower pads 270 may be provided on a bottom surface of the second circuit layer 220, and second upper pads 260 may be provided on a top surface of the second passivation layer 230. Second connection terminals 280 may be provided on second lower pads 270, respectively.

In some embodiments, the uppermost second semiconductor chip 200' may have a configuration different from the semiconductor chips 200. For example, the uppermost second semiconductor chip 200' may not have the second through electrode 240, the second passivation layer 230, and the second upper pad 260 which are included in the semiconductor chips 200. The uppermost second semiconductor chip 220' may include a second circuit layer which is the same as the second circuit layer 210 of the semiconductor chips 200.

An adhesive layer 500 may be provided between the first semiconductor chip 100 and the second semiconductor chip 200. A plurality of adhesive layers 500 may also be correspondingly interposed between the stacked second semiconductor chips 200 and 200'. The adhesive layers 500 may cover lateral surfaces of the second connection terminals 280.

A molding member 190 may cover a top surface of the base chip 100. The molding member 190 may cover lateral surfaces of the second semiconductor chips 200 and 200' and lateral surfaces of the adhesive layers 500.

The third semiconductor chip 300 may be provided on a center of a top surface of the interposer 800. The third semiconductor chip 300 may be a logic chip. The third semiconductor chip 300 may be, for example, a graphic processing unit (GPU) or a central processing unit (CPU). The third semiconductor chip 300 may include a third semiconductor substrate 310 and a third wiring layer 320. The third wiring layer 320 may include a third dielectric layer 321 and a third wiring structure 322 in the third dielectric layer 321.

Figure 3:
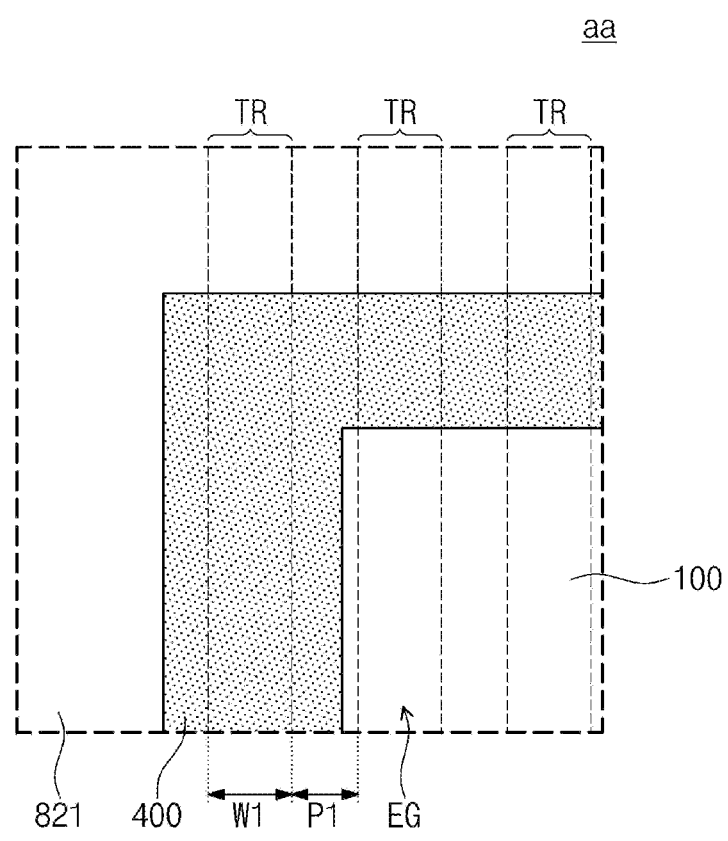
FIG. 3 illustrates an enlarged view showing section aa of FIG. 1.
Figure 4:
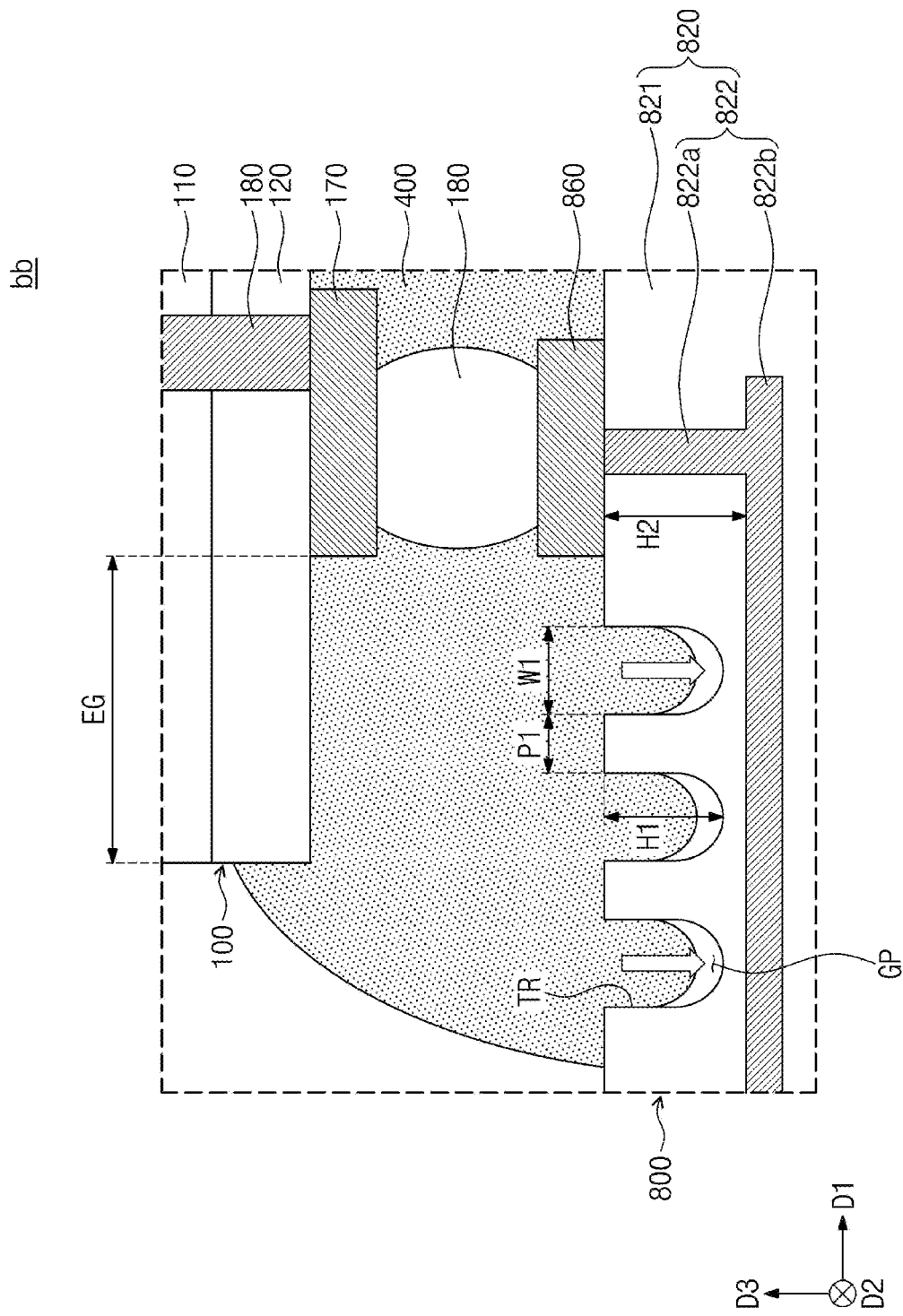
FIG. 4 illustrates an enlarged view showing section bb of FIG. 2.

FIG. 3 illustrates an enlarged view showing section aa of FIG. 1. FIG. 4 illustrates an enlarged view showing section bb of FIG. 2. Referring to FIGS. 1 and 3, the interposer 800 may be provided with one or more trenches TR at an upper portion of the interposer 800. The trenches TR may overlap an edge EG of the first semiconductor chip 100. In this description, the trench TR may be called a concave portion or a recessed portion.

The first semiconductor chip 100 may have an edge portion outside an outermost one of the first lower pads 170, and the portion of the first semiconductor chip 100 may be defined as an edge EG (i.e., an edge region) of the first semiconductor chip 100. Alternatively, the edge EG may be defined to refer to a portion of the first semiconductor chip 100, which portion is adjacent to a corner at a bottom surface of the first semiconductor chip 100. None of the trenches TR may vertically overlap the first lower pad 170. When viewed in a plan view, the trenches TR may be spaced apart from the first lower pad 170. In some embodiment, the edge EG may be an edge region of the first semiconductor chip 100 between an outermost side surface of the first semiconductor chip 100 and a region of the first semiconductor chip 100 where the first lower pad 170 is disposed.

Referring to FIGS. 3 and 4, the trenches TR may be formed at the top surface of the interposer 800. For example, the trenches TR may be formed in the wiring layer 820. When viewed in a plan view, each of the trenches TR may have a linear shape that extends along the second direction D2. The trench TR may have a width W1 in the first direction D1. The width W1 of the trench TR may range from about 10 μm to about 15 μm (i.e., may have a value between about 10 μm and about 15 μm). The trenches TR may be spaced apart from each other at a pitch P1 in the first direction D1. The pitch P1 may range from about 10 μm to about 15 μm (i.e., may have a value between about 10 μm and about 15 μm). The width W1 and the pitch P1 of the trenches TR may each be, for example, about 15 μm. The trench TR may have a depth H1 in the third direction D3. The depth H1 of the trench TR may range from about 30 μm to about 50 μm (i.e., may have a value between about 30 μm and about 50 μm). For example, the depth H1 of the trench TR may be about 37 μm. The trench TR may have a U shape when viewed in cross-section. The cross-section of the trench TR may be variously changed to have a shape to reduce stress. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The wiring structure 822 may include a via part 822a and a line part 822b. For example, the wiring structure 822 may include a via part 822a in contact with the upper pad 860 and a line part 822b provided below and connected to the via part 822a. The trenches TR may not expose the line part 822b. Each of the via parts 822a may have a thickness H2 in the third direction D3. The thickness H2 of each of the via parts 822a may be greater than the depth H2 of the trench TR. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

An under-fill 400 may fill at least a portion of the trench TR. According to some example embodiments, a gap GP may be present between the under-fill 400 and a bottom surface of the trench TR. In some embodiments, the gap GP may be an air gap. The term "air" as discussed herein, may refer to atmospheric air, or other gases that may be present during the manufacturing process. Therefore, the bottom surface of the trench TR may be vertically spaced apart from a lowermost portion of the under-fill 400. According to some example embodiments, the under-fill 400 may completely fill the trench TR.

According to the present inventive concepts, in fabricating the semiconductor package device 1, the under-fill 400 in a liquid state may be introduced between the first semiconductor chip 100 and the interposer 800. The under-fill 400 may include or may be formed of a material whose coefficient of thermal expansion (CTE) is high. The edge EG of the first semiconductor chip 100 may suffer from warpage greater than that at a central portion of the first semiconductor chip 100. When the under-fill 400 thermally expands, the under-fill 400 may expand into the trenches TR. As a result, a reduced stress may be applied to the first connection terminal 180, the line part 822b, and the upper pad 860 of the interposer 800, which may result in a reduction in the occurrence of crack. In conclusion, the semiconductor package device 1 may be more reliable (i.e., more resistant to occurrence of crack) in fabricating the semiconductor package device 1.

Figure 5:
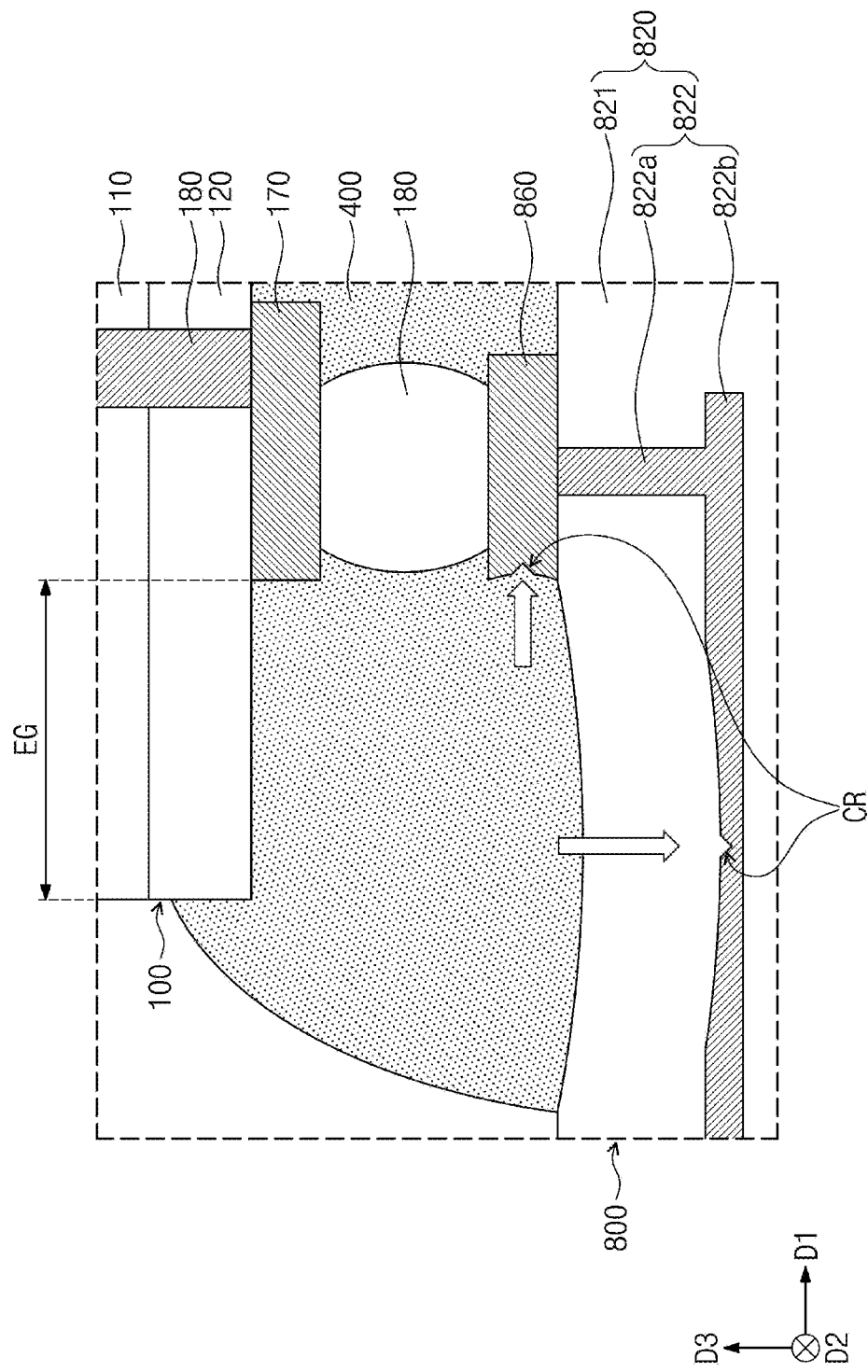
FIGS. 5 and 6 illustrate enlarged cross-sectional views of comparative examples that correspond to section bb of FIG. 2.
Figure 6:
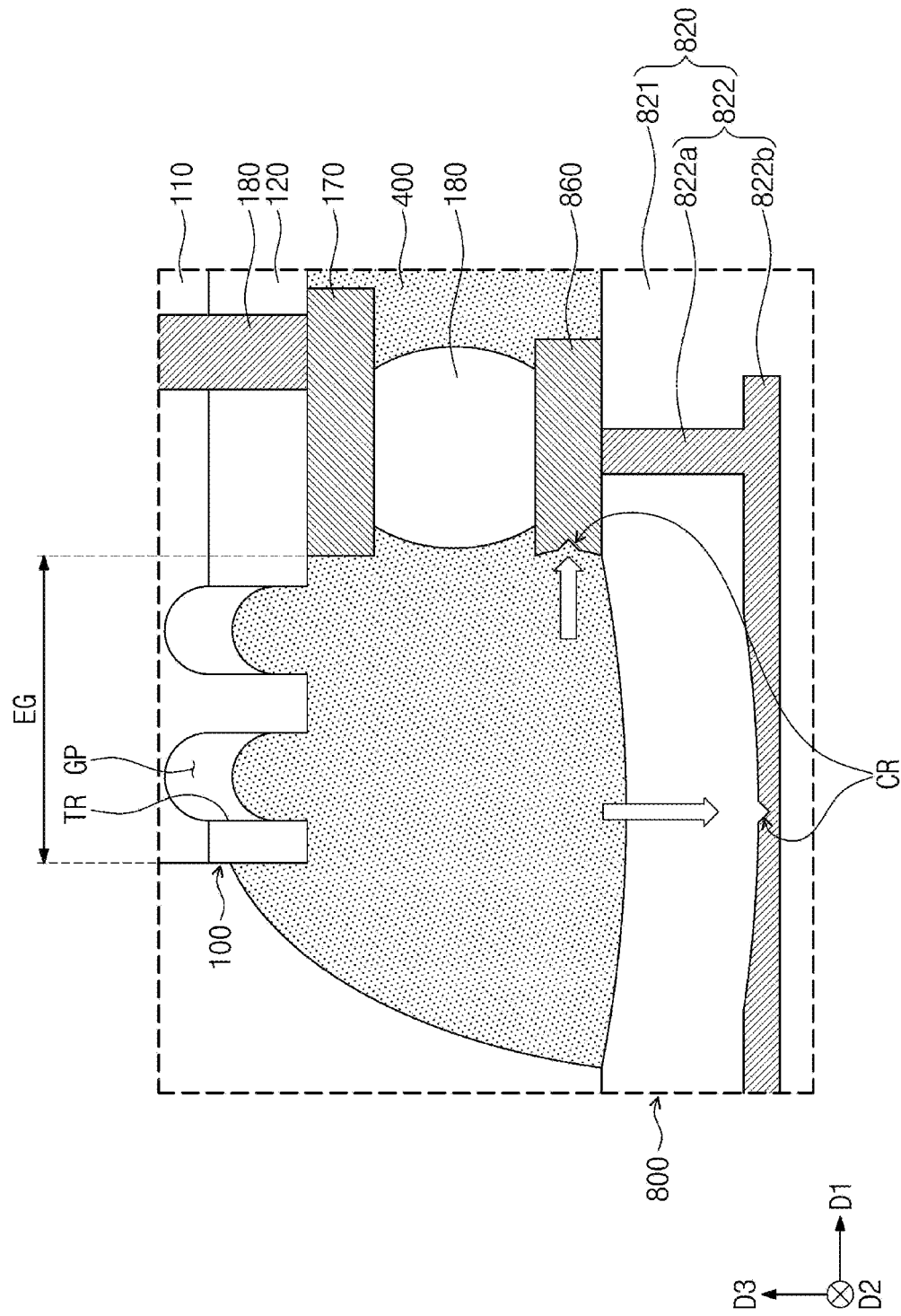
Figure 7:
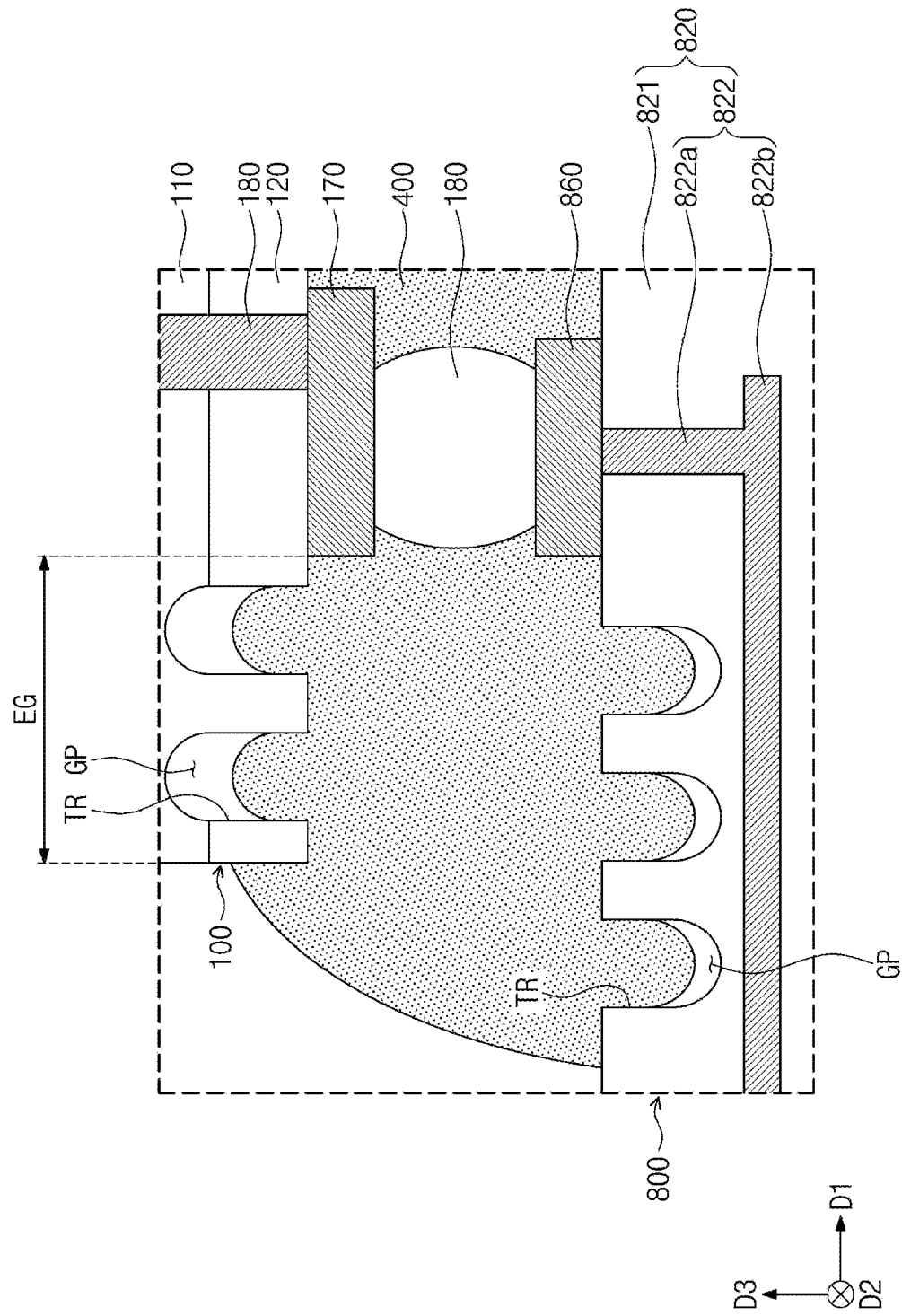
FIG. 7 illustrates an enlarged cross-sectional view that corresponds to section bb of FIG. 2.

FIGS. 5 and 6 illustrate enlarged cross-sectional views of comparative examples that correspond to section bb of FIG. 2. FIG. 7 illustrates an enlarged cross-sectional view that corresponds to section bb of FIG. 2.

Referring to FIG. 5, no trenches may be formed in the wiring layer 820 of the interposer 800. When the under-fill 400 expands, the upper pad 860 and the line part 822b may receive stress enough to create cracks.

Referring to FIG. 6, no trenches may be formed in the wiring layer 820 of the interposer 800. The trenches TR may be formed on the bottom surface of the first semiconductor chip 100. The trenches TR may be formed in the first circuit layer 120 and the first semiconductor substrate 110. According to some example embodiments, the trenches TR may be locally formed only in the first circuit layer 120. When the under-fill 400 expands, the effect of expansion may be smaller in a case where the under-fill 400 expands into the trenches TR formed in the first semiconductor chip 100 than in a case where the under-fill 400 expands into the trenches TR formed in the interposer 800. The under-fill 400 may not fill the trenches TR formed in the first semiconductor chip 100, and the gap GP may be present. The upper pad 860 and the line part 822b may receive stress enough to create cracks.

Referring to FIG. 7, the trenches TR may be formed at an upper portion of the wiring layer 820 of the interposer 800 and at a lower portion of the first semiconductor chip 100. Regardless of the presence of the trenches TR on the lower portion of the first semiconductor chip 100, the under-fill 400 may expand into the trenches TR formed at the interposer 800, and thus a reduced stress may be applied to the upper pad 860, the line part 822b, and the first connection terminal 180.

Figure 8:
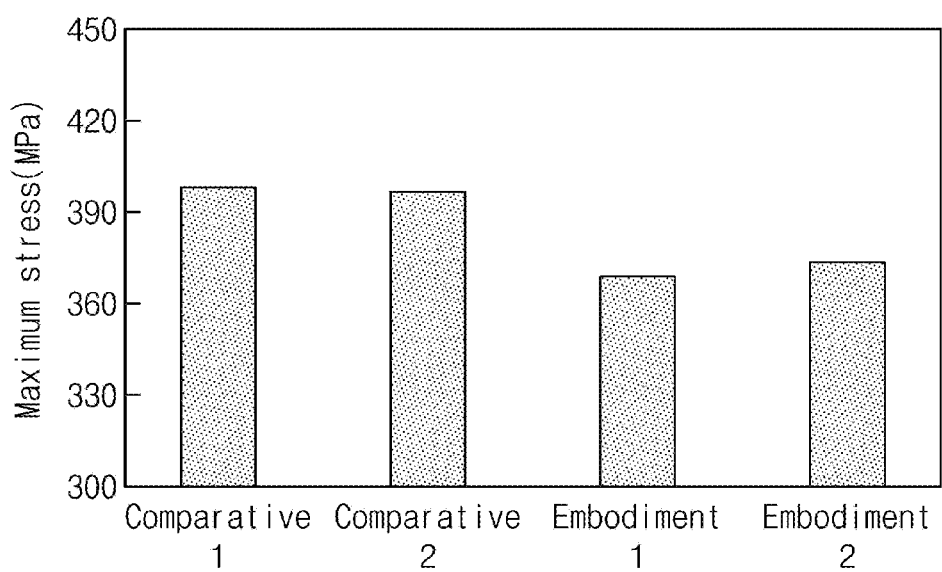
FIG. 8 illustrates a graph showing stresses applied to an upper pad according to embodiments and comparative examples.

FIG. 8 illustrates a graph showing stresses applied to an upper pad of an interposer according to embodiments and comparative examples.

Referring to FIG. 8, a stress of about 397.90 MPa is measured in case of Comparative 1 of FIG. 5, and a stress of about 396.75 MPa is measured in case of Comparative 2 of FIG. 6. In contrast, a stress of about 358.85 MPa is measured in case of Embodiment 1 of FIG. 2, and a stress of about 373.50 MPa was measured in case of Embodiment 2 of FIG. 7.

In comparison with Comparative 1 and Comparative 2, it may be ascertained that a stress reduction of about 0.2%, or almost no stress reduction, is obtained when a trench is formed at a first semiconductor chip. In comparison with Embodiment 1 and Comparative 1, it may be ascertained that a stress reduction of about 7.3% is obtained. In comparison with Embodiment 2 and Comparative 1, it may be ascertained that a stress reduction of about 6.1% is obtained. The stress measurement inspection may show that when a trench is provided at an interposer, an expansion space for an under-fill is securely obtained to reduce stress applied to upper pads and wiring lines on the interposer.

Figure 9:
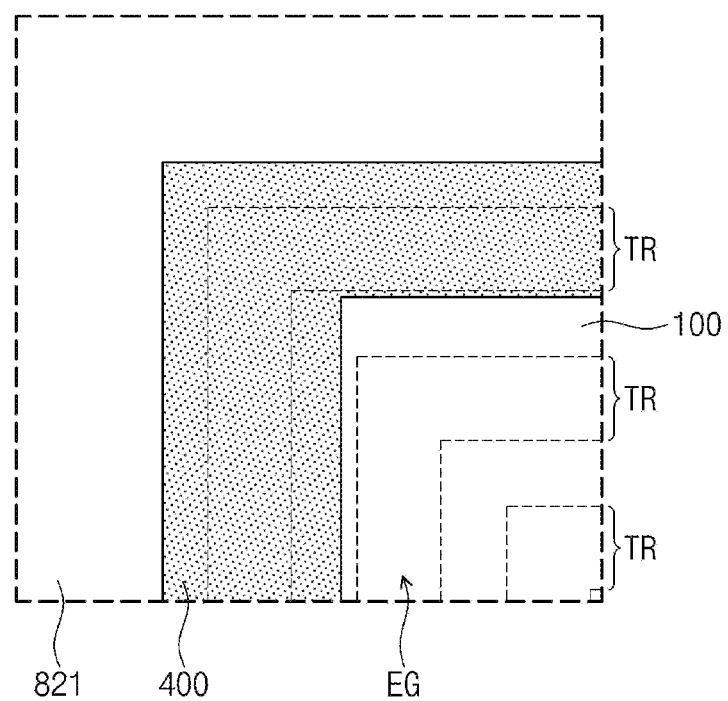

FIG. 9 illustrates a plan view that corresponds to section aa of FIG. 1, showing a semiconductor package device according to some example embodiments of the present inventive concepts.

Referring to FIG. 9, each of the trenches TR may have a tetragonal ring shape when viewed in a plan view. Each of the trenches TR may extend along the second direction D2 on the edge EG, and then may bend and extend along the first direction D1. When viewed in a plan view, each of the trenches TR may bend on a location adjacent to a corner of the first semiconductor chip 100. Some of the trenches TR may vertically overlap the edge EG of the first semiconductor chip 100. The others of the trenches TR may be disposed on locations adjacent to the first semiconductor chip 100. For example, FIG. 9 shows three trenches TR. The outermost trench may be disposed at a first region of the dielectric layer 821 of the interposer 800, and the other two trenches may be disposed at a second region of the dielectric layer 821. The first region of the dielectric layer 821 (i.e., the interposer 800) may be adjacent to the edge EG of the first semiconductor chip 100, without overlapping the first semiconductor chip 100, and the second region of the dielectric layer 821 (i.e., the interposer 800) may overlap the edge EG of the first semiconductor chip 100.

FIG. 10 illustrates a plan view that corresponds to section aa of FIG. 1, showing a semiconductor package device according to some example embodiments of the present inventive concepts.

Referring to FIG. 10, a plurality of holes HL may be provided to take the place of the trenches TR of FIGS. 3 and 9. Each of the holes HL may have a circular shape when viewed in a plan view. Some of the holes HL may vertically overlap the edge EG of the first semiconductor chip 100. The others of the holes HL may be disposed on locations adjacent to the edge EG of the first semiconductor chip 100. The holes HL may be arranged along the first direction D1 and/or the second direction D2. For example, FIG. 10 shows six outermost holes and six inner holes. The six outermost holes may be disposed at a first region of the dielectric layer 821 of the interposer 800, and the six inner holes may be disposed at a second region of the dielectric layer 821. The first region of the dielectric layer 821 (i.e., the interposer 800) may be adjacent to the edge EG of the first semiconductor chip 100, without overlapping the first semiconductor chip 100, and the second region of the dielectric layer 821 (i.e., the interposer 800) may overlap the edge EG of the first semiconductor chip 100.

Figure 11:
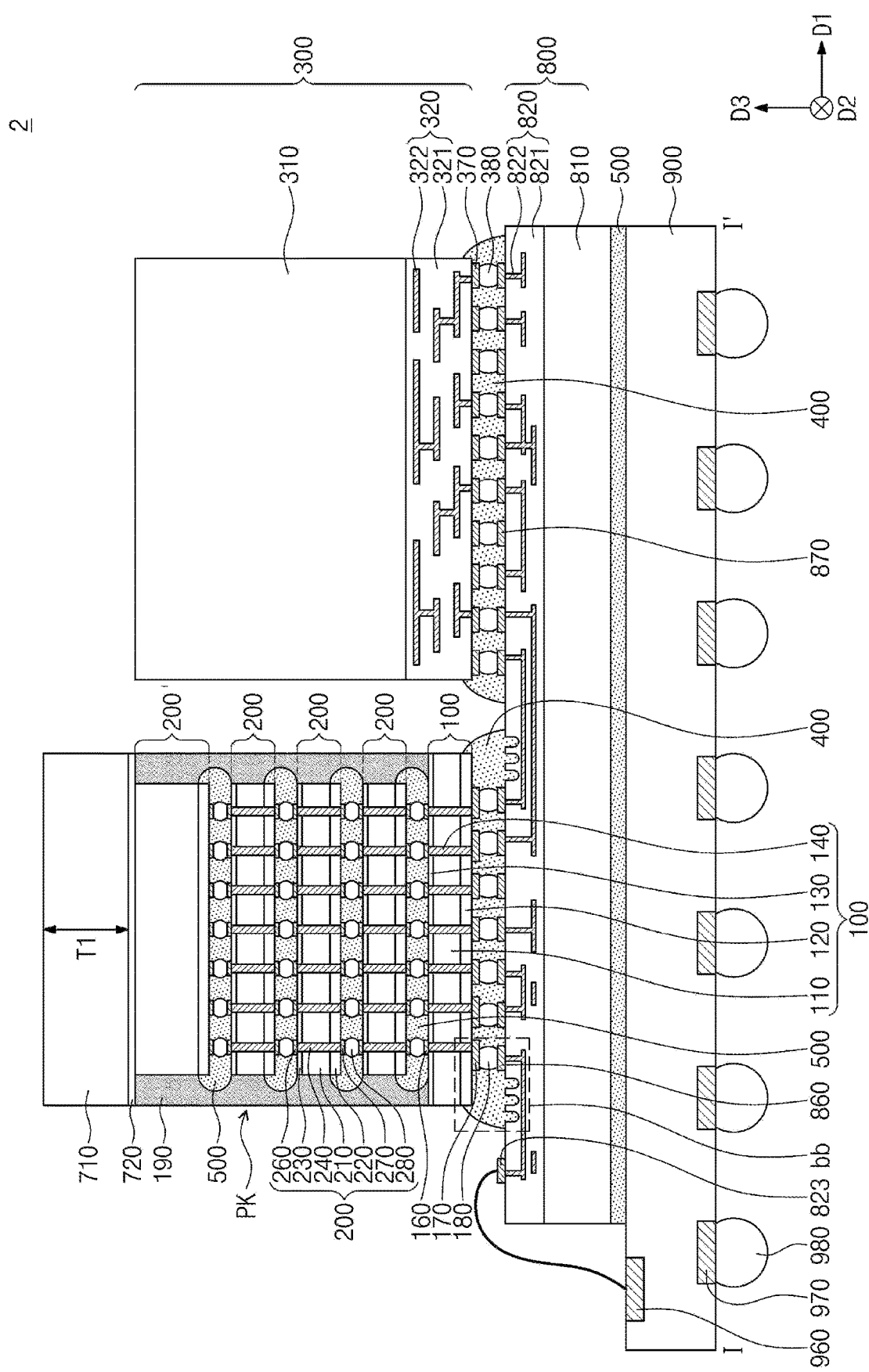
FIG. 11 illustrates a cross-sectional view taken along line I-I' of FIG. 1, showing a semiconductor package device according to some example embodiments of the present inventive concepts.

FIG. 11 illustrates a cross-sectional view taken along line I-I' of FIG. 1, showing a semiconductor package device according to some example embodiments of the present inventive concepts. Omission will be made to avoid explanations of those discussed with reference to FIGS. 1 to 4.

Referring to FIG. 11, a semiconductor package device 2 may be configured such that a heat sink 710 is provided on each of the semiconductor packages PK. The heat sink 710 may include a conductive material, such as metal. A thermal interface material 720 may be interposed between the heat sink 710 and each of the semiconductor packages PK. The heat sink 710 may have a thickness T1 of about 0.2 mm to about 1.2 mm (i.e., a thickness T1 between about 0.2 mm and about 1.2 mm) The heat sink 710 may have a predetermined thickness to reduce warpage of the semiconductor package PK. As a result, the interposer 800 may decrease in stress caused by warpage of the semiconductor package PK.

Figure 12:
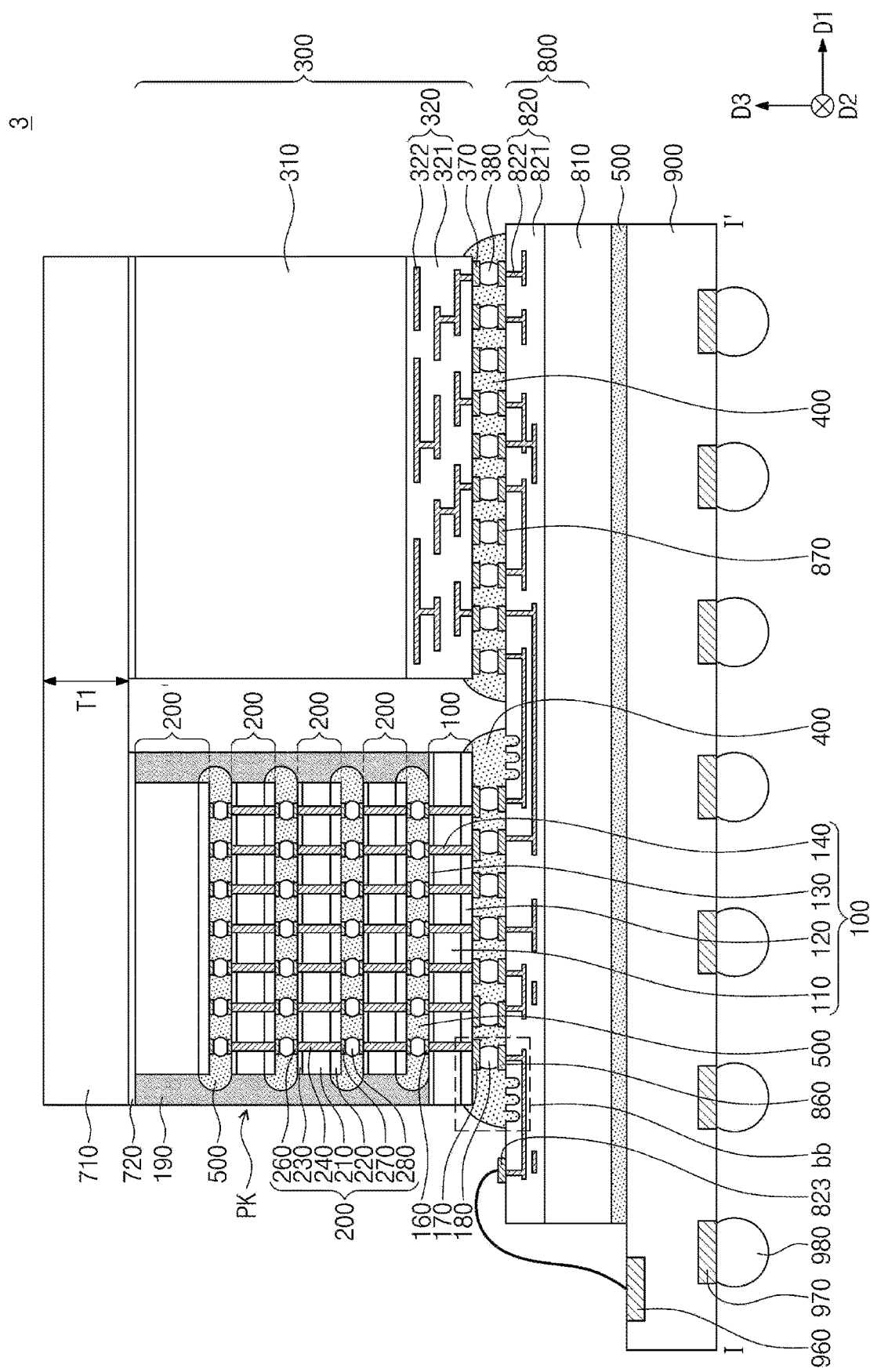
FIG. 12 illustrates a cross-sectional view taken along line I-I' of FIG. 1, showing a semiconductor package device according to some example embodiments of the present inventive concepts.

FIG. 12 illustrates a cross-sectional view taken along line I-I' of FIG. 1, showing a semiconductor package device according to some example embodiments of the present inventive concepts.

Referring to FIG. 12, a heat sink 710 may be provided in common on top surfaces of the semiconductor packages PK and a top surface of the third semiconductor chip 300. The top surfaces of the semiconductor packages PK may be located at substantially the same level as that of the top surface of the third semiconductor chip 300. A thermal interface material 720 may be interposed between the heat sink 710 and the semiconductor packages PK. A thermal interface material 720 may be interposed between the heat sink 710 and the third semiconductor chip 300. The heat sink 710 may have a thickness T1 of about 0.2 mm to about 1.2 mm (i.e., a thickness T1 between about 0.2 mm to about 1.2 mm) Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

According to the present inventive concepts, an interposer may include a plurality of trenches at its portion adjacent to an edge of a semiconductor package. When an under-fill expands between the semiconductor package and the interposer, the under-fill may expand into the trenches without applying a stress to the interposer, for example. As a result, it may be possible to reduce stress applied to an upper pad and a line part of the interposer and to increase reliability of the semiconductor package.

Although the present inventive concepts have been described in connection with some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package device, comprising:
a package substrate;
an interposer on the package substrate;
a semiconductor package on the interposer; and an under-fill between the interposer and the semiconductor package,
wherein the interposer is provided with at least one first trench at an upper portion of the interposer, the at least one first trench extending in a first direction parallel to a top surface of the package substrate,
wherein the at least one first trench vertically overlaps an edge region of the semiconductor package, and
wherein the under-fill fills at least a portion of the at least one first trench.

2. The semiconductor package device of claim 1,
wherein the interposer includes:
a silicon substrate;
a wiring layer on the silicon substrate; and
a pad on the wiring layer,
wherein the wiring layer includes a dielectric layer and a wiring structure in the dielectric layer,
wherein the wiring structure includes a via part in contact with the pad, and
wherein a depth of the first trench is less than a thickness of the via part.

3. The semiconductor package device of claim 2,
wherein the dielectric layer includes an epoxy compound and fiberglass impregnated in the epoxy compound.

4. The semiconductor package device of claim 2,
wherein the wiring structure further includes a line part connected to the via part, and
wherein the line part is disposed lower than a bottom surface of the first trench.

5. The semiconductor package device of claim 1,
wherein the at least one first trench includes a plurality of trenches,
wherein each of the plurality of trenches has a width in a second direction that intersects the first direction, the second direction being parallel to the top surface of the package substrate, and
wherein the plurality of trenches are spaced apart from each other at a pitch in the second direction.

6. The semiconductor package device of claim 5, wherein
the width has a value between about 10 μm and about 15 μm, and
the pitch has a value between about 10 μm and about 15 μm.

7. The semiconductor package device of claim 5,
wherein a depth of each of the plurality of trenches has a value between about 30 μm and about 50 μm.

8. The semiconductor package device of claim 1,
wherein the semiconductor package includes:
a first semiconductor chip; and
a plurality of second semiconductor chips stacked on the first semiconductor chip,
wherein the first semiconductor chip includes:
a first semiconductor substrate; and
a plurality of first through electrodes that penetrate the first semiconductor substrate, and
wherein each of the second semiconductor chips includes:
a second semiconductor substrate; and
a plurality of second through electrodes that penetrate the second semiconductor substrate.

9. The semiconductor package device of claim 8,
wherein a gap is present between the under-fill and a bottom surface of the first trench.

10. The semiconductor package device of claim 8, further comprising:
a plurality of second trenches formed at a lower portion of the first semiconductor chip and vertically overlapping the edge region of the first semiconductor chip,
wherein the under-fill fills a portion of each of the plurality of second trenches.

11. The semiconductor package device of claim 1,
wherein the at least one first trench includes a trench including a first portion extending in the first direction, a second portion being bent at a location that vertically overlaps a corner of the semiconductor package, and a third portion extending in a second direction parallel to the top surface of the package substrate, the second direction intersecting the first direction, and
wherein the third portion connects the first portion and the second portion with each other.

12. The semiconductor package device of claim 1, further comprising:
a third semiconductor chip on the interposer,
wherein the third semiconductor chip is spaced apart from the semiconductor package.

13. The semiconductor package device of claim 12, further comprising:
a heat sink on the semiconductor package,
wherein a thickness of the heat sink is between about 0.2 mm and about 1.2 mm.

14. The semiconductor package device of claim 12, wherein
a top surface of the semiconductor package and a top surface of the third semiconductor chip are located at substantially the same level,
the semiconductor package device further comprises a heat sink on the semiconductor package and the third semiconductor chip, and
a thickness of the heat sink is between about 0.2 mm and about 1.2 mm.

15. A semiconductor package device, comprising:
a package substrate;
an interposer on the package substrate;
a semiconductor package on the interposer; and
an under-fill between the interposer and the semiconductor package,
wherein the interposer includes:
a silicon substrate;
a wiring layer on the silicon substrate; and
an upper pad on the wiring layer,
wherein the wiring layer includes:
a dielectric layer provided with a plurality of concave portions at an upper portion of the dielectric layer, the plurality of concave portions vertically overlapping an edge region of the semiconductor package; and
a wiring structure in the dielectric layer,
wherein the wiring structure includes a via part in contact with the upper pad, and
wherein a depth of each of the concave portions is less than a thickness of the via part.

16. The semiconductor package device of claim 15, wherein
each of the plurality of concave portions has a hole shape, and
the plurality of concave portions are arranged in a first direction parallel to a top surface of the package substrate.

17. The semiconductor package device of claim 15,
wherein the under-fill fills at least a portion of each of the plurality of concave portions.

18. The semiconductor package device of claim 15,
wherein, when viewed in a plan view, the plurality of concave portions are spaced apart from the upper pad.

19. The semiconductor package device of claim 15,
wherein the semiconductor package includes:
- a first semiconductor chip;
- a plurality of second semiconductor chips stacked on the first semiconductor chip; and
- a plurality of adhesive layers disposed in a space between the first semiconductor chip and a lowermost second semiconductor chip of the plurality of second semiconductor chips and between spaces between two adjacent second semiconductor chips of the plurality of second semiconductor chips, respectively, wherein the first semiconductor chip includes:
- a first semiconductor substrate; and
- a plurality of first through electrodes that penetrate the first semiconductor substrate, and wherein each of the plurality of second semiconductor chips includes:
- a second semiconductor substrate; and
- a plurality of second through electrodes that penetrate the second semiconductor substrate.

20. A semiconductor package device, comprising:
- a package substrate;
- an interposer on the package substrate;
- a plurality of semiconductor packages on the interposer, each of the plurality of semiconductor packages including a first semiconductor chip and a plurality of second semiconductor chips that are sequentially stacked on the first semiconductor chip; and
- an under-fill between the interposer and the first semiconductor chip, wherein each of the first semiconductor chip and the plurality of second semiconductor chips includes a plurality of through electrodes, wherein the interposer is provided with a plurality of trenches at an upper portion of the interposer, the plurality of trenches extending in a first direction parallel to a top surface of the package substrate, wherein at least one of the plurality of trenches vertically overlaps an edge region of the first semiconductor chip, wherein the under-fill fills at least a portion of each of the plurality of trenches, wherein each of the plurality of trenches has a width in a second direction parallel to the top surface of the package substrate, the second direction intersecting the first direction, wherein the plurality of trenches are spaced apart from each other at a pitch in the second direction, wherein the width is between about 10 μm and about 15 μm, wherein the pitch is between about 10 μm and about 15 μm, and wherein a depth of each of the trenches is between about 30 μm and about 50 μm.

* * * * *